MICROWAVE SEMICONDUCTOR OSCILLATOR EMPLOYING III-V COMPOUND AND DOPED TIN CONTACT

Filed July 5, 1968

INVENTORS
RUDOLF P. TIJBURG
DIRK de NOBEL
BY
AGENT 3,544,859

MICROWAVE SEMICONDUCTOR OSCILLATOR EMPLOYING III–V COMPOUND AND DOPED TIN CONTACT

Rudolf Paulus Tijburg and Dirk de Nobel, Emmasingel, Eindhoven, Netherlands, assignors, by mesne assignments, to U.S. Philips Corporation, New York, N.Y., a corporation of Delaware Filed July 5, 1968, Ser. No. 742,625
Claims priority, application Netherlands, July 22, 1967, 6710184
Int. Cl. H011 3/00
U.S. Cl. 317—235 6 Claims

ABSTRACT OF THE DISCLOSURE

A semiconductor microwave oscillator of the Gunn effect type is described employing an n-type $A^{III}$-$B^{V}$ compound and an ohmic contact of tin plus sulphur, selenium or tellurium.

The invention relates to a semiconductor device comprising a semiconductor body which consists essentially of an $A^{III}$-$B^{V}$ compound, or a mixed crystal thereof, of the n-type and which has one or more tin-containing ohmic contacts having a low resistance.

The invention particularly relates to semiconductor devices intended for producing microwave oscillations, the so called "Gunn effect devices." These Gunn effect devices are formed by a wafer of an $A^{III}$-$B^{V}$ compound, for example GaAs, provided, for example, on both sides with ohmic contacts. When these contacts are connected to a voltage source and if a given high threshold value of the electric field is exceeded, which value may, depending upon various factors, be some few thousand volts per cm., electro-magnetic oscillations of a high frequency (for example about 5 gHz) may be generated (see J. B. Gunn: I.B.M. Journal of Research and Development, vol. 8 pages 141 to 159 (1964)).

With the known construction only a small fraction of the energy fed to the Gunn effect device is converted into energy of the produced oscillation. This fraction depends intimately upon the heat transfer and the frequency. Consequently a large part of the energy supplied is converted in the Gunn effect device into heat. Owing to the high thermal dissipation especially high-ohmic materials are used, on which, in general, ohmic contacts can be provided only with greater difficulty than on low-ohmic materials.

When the contacts are less satisfactorily ohmic and/or exhibit a high resistance, said fraction may be even smaller or even the semiconductor device may not at all exhibit said generation effect. This even applies to tin-containing contacts, in which tin constitutes a main or at least an essential part, since although tin is a donor for $A^{III}$-$B^{V}$ compounds, they bring about often an inadequate efficiency of the energy supplied.

The invention provides an improvement in this respect. It has been found that the energy of the oscillation produced is materially raised at a given value of the energy supplied to the device by the addition of given elements, while the advantageous technologic properties of tin are maintained.

A semiconductor device comprising a semiconductor body consisting mainly of an $A^{III}$-$B^{V}$ compound, or a mixed crystal thereof, of the n-type, which body has one or more tin-containing ohmic contacts having a low resistance, is therefore characterized in that at least one of these contacts contains one or more of the elements of the group of the chalcogenes. In devices for producing microwave oscillations ohmic contacts are preferably provided on GaAs and on mixed crystals of the formula $GaAsP_{1-x}$, wherein $0.5<x<1$.

The concentration regions in which the added chalcogenes are preferably present, are: $0.1\leqq Te<10\%$ and/or $0.1\leqq Se<5\%$ and/or $\leqq 0.1\leqq S<2\%$; below the lower limit the effect will, as a rule, not be great, although this often depends upon the conditions of production, and above the upper limit phenomena such as high alloying temperatures, decomposition of the mixture and brittleness may occur. Since already small quantities of the chalcogenes are effective, this mixture maintains the favorable technologic properties of tin.

It has furthermore been found that when semi-conductor devices according to the invention are employed in circuit arrangements the electric field strength at least locally in the semiconductor body, has to be at least 2000 v. per cm. and in many cases has to exceed even 3000 v. per cm. in order to obtain the Gunn effect.

The invention will be described with reference to the figures.

Figure 1:
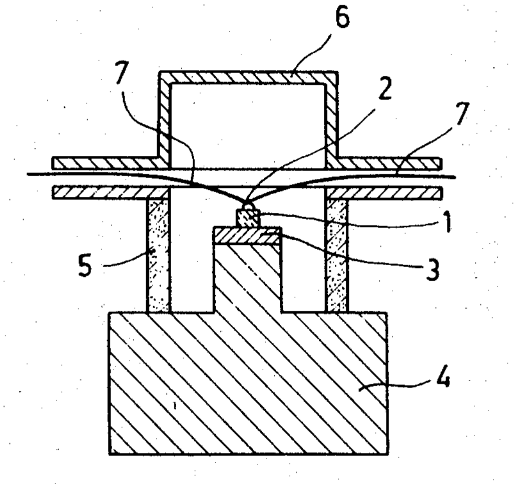
FIG. 1 is a cross sectional view of one embodiment of the semiconductor device according to the invention.

The semiconductor device shown in FIG. 1 comprises a semiconductor body 1 in which the microwave oscillations are produced.

This body 1 is soldered to a copper block 4, provided with a molybdenum layer 3 of about 125$\mu$ thick. The block 4 is insulated by a ceramic ring 5 of sintered alumina from the metallic closing member 6. The body 1 is connected electrically and thermally via the ohmic contact 2 and two nickel wires 7 of about 50$\mu$ thick to the closing member 6.

The copper block 4 and the closing member 6 may be connected to a voltage source (not shown).

Figure 2:
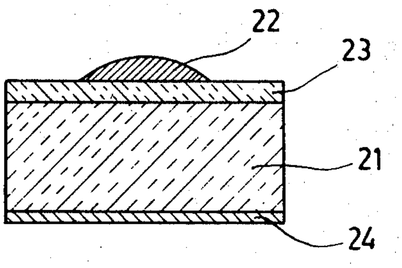
FIG. 2 is a cross sectional view of the detail (1,2) of FIG. 1.

FIG. 2 shows in detail the construction of the semiconductor body 1 and the ohmic contact 2. Reference numeral 21 designates a wafer of gallium arsenide of about 300$\mu$ x 300$\mu$ and about 85$\mu$ thick. A layer 23 also consisting of GaAs, about 20$\mu$ thick and having a resistivity of, for example, 1 ohm. cm. is epitaxially grown thereon. The wafer 21 is connected through a layer 24 of about 0.5$\mu$ thick of alpha-metal of a composition of about 38% by weight of Au, 45% by weight of Ag and 17% by weight of Ge to the layer 3 of FIG. 1. On the epitaxial layer 23 is provided the ohmic contact 22 to which the wires 7 of FIG. 1 are connected.

The contact 22 consists of tin to which, in accordance with the invention, is added a given quantity of S, Se or/and Te. The contact is made by alloying or vapour deposition. The layer 23 is covered by a mica dish with a hole. The hole is provided with a quantity of an alloy of Sn with 2% by weight of Se. It is alloyed to the substrate by heating in a furnace at a temperature between 500 and 700° C. in a hydrogen atmosphere. The time of the heat treatment is about 20 minutes i.e. 5 minutes for heating to the maximum temperature and 15 minutes for cooling off. When during heating up the temperature of 350° C. is passed by, a small quantity of HCl-gas is added to the atmosphere in order to improve the wetting properties of the GaAs by the contact material. Instead of the addition of HCl-gas, a crystal of $NH_4Cl$ may be placed in the furnace at the beginning of the heating, which crystal provides the HCl atmosphere by decomposition at higher temperatures.

Sn with 2% by weight of Se may also be applied by vapour deposition in a bell jar in vacuo at normal temperature.

A layer of 500 A. thickness is deposited. Subsequently a silver layer of 5000 A. is vapour deposited as a consequence of which the Sn-Se-alloy flows better over the surface of the GaAs during the following heat treatment. The heat treatment after vapour deposition is the same as described above with the exception that no HCl-gas or $NH_4Cl$ is added. If the tin contains 2% by weight of one of these three elements, the energy of the oscillation produced has approximately doubled with the same energy supplied to the device.

The chalcogenes are introduced into the tin by prealloying or deposition from the vapour phase.

The invention is, of course, not restricted to the example given above. For example, in order to obtain given properties or an integrated microwave circuit, it may be desirable to provide the current input and output on the same side of the semiconductor body instead of arranging them on opposite sides. Moreover, the semiconductor device according to the invention may be manufactured on the basis of a mixed crystal of GaAs and GaP. Apart from tin with additions from the group of the chalcogenes, the contacts may contain other elements which behave neutrally or at least do not affect adversely the effectiveness of the contact.

What is claimed:

1. In an electrical high frequency device comprising a microwave oscillation semiconductor body consisting essentially of $A^{III}$-$B^{V}$ compound material or a mixed crystal thereof and of n-type conductivity and ohmic contacts connected thereto with at least one of the contacts containing tin and having low resistance relative to said body, the improvement comprising at least said one contact containing at least one material selected from the group consisting of sulphur, selenium and tellurium.

2. An electrical device as set forth in claim 1 wherein the $A^{III}$-$B^{V}$ compound is GaAs.

3. An electrical device as set forth in claim 1 wherein the mixed crystal comprises $GaAs_xP_{1-x}$, wherein $0.5<x<1$.

4. An electrical device as set forth in claim 1 wherein the contact is predominantly of tin, and when the material added to the contact is tellurium, the tellurium content is greater than 0.1 up to 1% by weight, and when the material added is selenium, the selenium content is at least 0.1 up to 5% by weight, and when the material added is sulphur, the sulphur content is at least 0.1 up to 2% by weight.

5. A circuit arrangement comprising an electrical device as set forth in claim 1 and including a second contact on the body, and means for applying across the contracts a voltage establishing at least locally in the semiconductor body an electric field strength exceeding 2000 volts per centimeter.

6. A circut as set forth in claim 5 wherein the electric field strength exceeds 3000 volts per centimeter.

References Cited

UNITED STATES PATENTS

| | | | |
|---|---|---|---|
| 3,151,004 | 9/1964 | Glicksman et al. ---- | 317—237 |
| 3,255,056 | 6/1966 | Flatley et al. -------- | 317—237 |
| 3,313,663 | 4/1967 | Yeh et al. ------ | 317—237 X |
| 3,483,443 | 12/1969 | Mayer et al. -------- | 317—234 |

JAMES D. KALLAM, Primary Examiner

U.S. Cl. X.R.

317—237